(12) United States Patent
Fink

(10) Patent No.: US 7,147,793 B2
(45) Date of Patent: *Dec. 12, 2006

(54) METHOD OF AND APPARATUS FOR TAILORING AN ETCH PROFILE

(75) Inventor: Steven Fink, Mesa, AZ (US)

(73) Assignee: Tokyo Electron Limited, Tokyo (JP)

( * ) Notice: Subject to any disclaimer, the term of this patent is extended or adjusted under 35 U.S.C. 154(b) by 206 days.

This patent is subject to a terminal disclaimer.

(21) Appl. No.: 10/479,458

(22) PCT Filed: Jun. 6, 2002

(86) PCT No.: PCT/US02/11900

§ 371 (c)(1),
(2), (4) Date: Dec. 2, 2003

(87) PCT Pub. No.: WO02/101116

PCT Pub. Date: Dec. 19, 2002

(65) Prior Publication Data

US 2004/0157445 A1   Aug. 12, 2004

Related U.S. Application Data

(60) Provisional application No. 60/296,144, filed on Jun. 7, 2001.

(51) Int. Cl.
*C23C 14/34* (2006.01)
*C23F 1/00* (2006.01)

(52) U.S. Cl. .................... 216/71; 216/67; 216/59; 156/345.33; 156/345.34; 204/298.07; 204/298.32; 204/298.33

(58) Field of Classification Search ........... 156/345.33, 156/345.34; 216/59, 67, 71; 204/298.07, 204/298.32, 298.33
See application file for complete search history.

(56) References Cited

U.S. PATENT DOCUMENTS

| 4,342,901 | A | * | 8/1982 | Zajac ..................... 219/121.4 |
| 5,628,869 | A | * | 5/1997 | Mallon ..................... 438/694 |
| 5,925,212 | A | * | 7/1999 | Rice et al. .............. 156/345.27 |
| 5,997,686 | A | | 12/1999 | Lardon et al. ......... 156/345.38 |
| 6,090,303 | A | | 7/2000 | Collins et al. ................ 216/68 |
| 6,872,259 | B1 | * | 3/2005 | Strang .......................... 118/715 |
| 2003/0042227 | A1 | * | 3/2003 | Fink .............................. 216/63 |

* cited by examiner

*Primary Examiner*—Rodney G. McDonald
(74) *Attorney, Agent, or Firm*—Oblon, Spivak, McClelland, Maier & Neustadt, P.C.

(57) ABSTRACT

An etch profile tailoring system (100), for use with an etching process carried out on a wafer (130), has a scavenging plate (170) with a baseline etch profile, and at least one etch profile tuning structure (such as a plug) (160) replaceably disposed with respect to the scavenging plate (170) and configured to alter the baseline etch profile during the etching process so as to arrive at a desired etch profile. A method of performing maintenance on an etch profile tailoring system (100) involves the steps of performing an etching process on a wafer in accordance with a desired etch profile, determining whether or not maintenance should be performed, and (if the maintenance decision indicates that maintenance should be performed) replacing with a second plug before conducting an etching process on additional wafers.

25 Claims, 3 Drawing Sheets

METHOD OF AND APPARATUS FOR TAILORING AN ETCH PROFILE

CROSS-REFERENCE TO RELATED APPLICATIONS

The present application is related to and claims priority to U.S. provisional application Ser. No. 60/296,144, filed Jun. 7, 2001 entitled "METHOD OF AND APPARATUS FOR TAILORING AN ETCH PROFILE." The contents of that application are incorporated herein by reference.

BACKGROUND OF THE INVENTION

1. Field of the Invention

The present invention relates to methods and apparatus for controlling the shape of etch profiles in semiconductor etching processes. More specifically, the invention relates to methods and apparatus for tailoring etch profiles using removable plugs that are tailored to particular etching processes.

2. Description of the Background

Manufacturers of semiconductor integrated circuits (ICs) are faced with intense competitive pressure to improve their products and the processes of fabricating them. A major business motivation for these manufacturers is the lowering of production costs through improvement of product throughput, quality and complexity. These improvements are in part a result of improving control over the etch rate as well as etch uniformity within a process. Because of this motivation for IC manufacturers, there is a need for a low cost way to tune processes to provide uniformly high-quality products. Fulfilling that need would provide a manufacturer of such equipment a competitive edge.

One goal is to improve tool performance at low cost. The company that can enhance tool performance without increasing tool cost is in a position to increase profit margins. Especially in cyclical industries such as the semiconductor capital equipment industry, increased profit margins can have a dramatic impact on market penetration.

To improve tool performance, several challenges are presented, such as how to increase uniformity of an etch profile, how to achieve a proper chemical balance of plasma, and how to spatially alter the chemistry of plasma above a wafer.

Concerning how to increase uniformity of an etch profile, in spite of significant advances most etch processes still induce an undesirably non-uniform etch profile 31, as illustrated in FIG. 1. Etch profile 31 illustrates how a conventional arrangement of a scavenging plate 70 mounted on an aluminum electrode 40 and located with respect to a wafer 30 causes etching to occur faster in the center of the wafer than at its periphery. It is desired to have an etch profile that is substantially flat (constant) throughout the entire surface of wafer 30, rather than declining toward the periphery as shown in FIG. 1. Non-symmetrical exhaust flow, temperature variations, non-uniform plasma chemistry, non-uniform ion density and/or non-uniform gas supply not only cause variations in the etch rate, but also adversely affect selectivity and device side wall profiles. Accordingly, there is still a need in the art to increase uniformity of etch profiles.

Concerning how to achieve a proper chemical balance of plasma, it is recognized that plasma reactors exploit the formation of chemically active plasma using carefully selected gases. As integrated circuit manufacturers push tool vendors to achieve higher etch rates and tighter-controlled etching, the need for balancing the chemical composition of the plasma increases. A high etch rate demands a large volume of plasma at a high density. This is typically done using inductively coupled plasma. For fluorocarbon chemistries in oxide (e.g., $SiO_2$) etch, an inductively coupled plasma reactor is highly dissociative, which, if left uncontrolled, results in a large number of fluorine radicals created within the plasma and a poor selectivity between oxide etch to silicon etch. Moreover, fluorine radicals degrade etch performance characteristics including side wall profiles, and are thus undesirable. Accordingly, there is still a need in the art to achieve a proper chemical balance of plasma.

Concerning the problem of how to spatially alter the chemistry of plasma above a wafer, the undesirably etch profile illustrated in FIG. 1 is well known. Numerous approaches to altering plasma chemistry have been considered, with varying degrees of success. One way to adjust the chemistry of plasma is to expose the plasma to a chemically active substance. In many applications, silicon reacts favorably with plasma, for example if there is atomic fluorine present. Consequently, one solution is to include a silicon plate in the upper electrode to act as a scavenger. However, the limitation of this approach is that scavenging occurs uniformly across the scavenging plate. One solution to this limitation is to induce a counter shape in the scavenging plate. However, the results of this approach are hard to control, and can be very expensive because the shape and structure of the costly scavenging plate itself are involved. Accordingly, there is still a need in the art for a way to spatially alter the chemistry of plasma above a wafer in a controllable and cost-effective manner.

Various patents disclose methods dealing with non-uniform etching or a related problem of non-uniform implantation. U.S. Pat. No. 4,340,461 (Hendricks et al.), "Modified RIE chamber for uniform silicon etching," discloses a plasma enhancing baffle plate employed in conjunction with the anode of an RIE system to attempt to provide uniform silicon etching. Various aperture arrangements may be employed to provide different patterns of neutral etching species generation. U.S. Pat. No. 4,392,932 (Harra), "Method for obtaining uniform etch by modulating bias on extension member around radio frequency etch table," describes a method for etching a semiconductor wafer on an RF etch table that employs a succession of different biases on an extension member positioned adjacent the periphery of the table. The aggregation of etch profiles attempts to produce a more uniform overall etch profile. U.S. Pat. No. 5,552,017 (Jang et al.), "Method for improving the process uniformity in a reactor by asymmetrically adjusting the reactant gas flow," discloses a method for improving etch rate uniformity and chemical vapor deposition uniformity using an asymmetric gas distribution system to increase the reactant gas flow over regions of the wafer where the etch rates are low. U.S. Pat. No. 5,897,712 (Hanawa et al.), "Plasma uniformity control for an inductive plasma source," discloses reducing an RF induction field over areas of a wafer experiencing higher etch or deposition rates. U.S. Pat. No. 6,132,632 (Haney et al.), "Method and apparatus for achieving etch rate uniformity in a reactive ion etcher," discloses use of a magnet array for locally controlling etch rates across a cathode to attempt to produce a uniform etch rate distribution in a reactive ion etcher. However, each of these methods, involving baffle plates and aperture arrangements, biases for an RF etch table, asymmetric gas distribution, asymmetric RF induction fields, or magnet arrays, are complex to design, build and operate. A simpler, more direct and more cost-effective approach is needed.

It is to meet the foregoing needs, among others, that the present invention is directed.

SUMMARY OF THE INVENTION

The present invention provides an etch profile tailoring system for use with an etching process carried out on a wafer, the etch profile tailoring system having a scavenging plate configured to function in accordance with a baseline etch profile during the etching process, and at least one etch profile tuning structure, replaceably disposed with respect to the scavenging plate, and configured to alter the baseline etch profile during the etching process so as to arrive at a desired etch profile for the process.

The invention also provides an etch profile tailoring method for use with an etching process, the method having steps of providing a scavenging plate that functions in the etching process in accordance with a baseline etch profile, and altering the baseline etch profile to arrive at a desired etch profile by inserting at least one replaceable etch profile tuning structure.

The invention further provides a method of performing maintenance on an etch profile tailoring system used in etching processes carried out on wafers, the etch profile tailoring system including etch profile tuning structures configured to alter a baseline etch profile to arrive at respective desired etch profiles. The method involves the steps of performing an etching process on a wafer in accordance with the desired etch profile, determining whether or not maintenance should be performed on the etch profile tailoring system to arrive at a maintenance decision, and (if the maintenance decision indicates that maintenance should be performed) replacing a first etch profile tuning structure with a second etch profile tuning structure before conducting an etching process on additional wafers.

The invention additionally provides a method of tailoring etch profiles to first and second etching processes that have a baseline etch profile in common. The method has the steps of altering the baseline etch profile using a first etch profile tuning structure so as to define a first desired etch profile, and performing the first etching process in accordance with the first desired etch profile. Thereafter, the process involves replacing the first etch profile tuning structure with a second etch profile tuning structure to thus alter the baseline etch profile using the second etch profile tuning structure, so as to define a second desired etch profile. Finally, the method involves performing the second etching process in accordance with the second desired etch profile.

Preferably, the etch profile tuning structure is a plug that is removably insertable into a plug hole formed in the scavenging plate. The plug is preferably made of a material that is a scavenging material for the etching process. In one embodiment, the plug is radially symmetrical about a center line that passes through a center of a plug hole centrally located in the scavenging plate. In other embodiments, additional plugs are arranged about the scavenging plate so as to form a pattern of plugs that affects the etch profile. According to an optional feature, the plug hole in the scavenging plate and the plug are complementarily threaded, and the threaded plug can be screwed in the threaded plug hole to adjust an amount by which the threaded plug protrudes into a process chamber in which the process is performed.

Other objects, features and advantages of the present invention will be apparent to those skilled in the art upon a reading of this specification including the accompanying drawings.

BRIEF DESCRIPTION OF THE DRAWINGS

The invention is better understood by reading the following Detailed Description of the Preferred Embodiments with reference to the accompanying drawing figures, in which like reference numerals refer to like elements throughout, and in which.

DETAILED DESCRIPTION OF THE PREFERRED EMBODIMENTS

Figure 1:
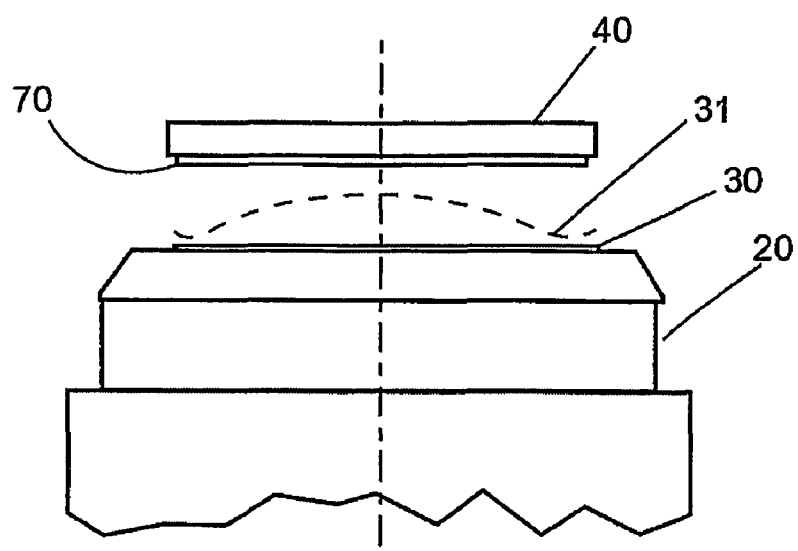
FIG. 1 illustrates a conventional arrangement of semiconductor wafer etching equipment and its undesirable etch profile 31.

In describing preferred embodiments of the present invention illustrated in the drawings, specific terminology is employed for the sake of clarity. However, the invention is not intended to be limited to the specific terminology so selected, and it is to be understood that each specific element includes all technical equivalents that operate in a similar manner to accomplish a similar purpose.

Briefly, preferred embodiments of the present invention provide a system for spatially tailoring an etch profile in a plasma etch chamber. Preferred systems include one or more interchangeable scavenging plugs protruding through the surface of a scavenging plate that can be located on an upper electrode in the chamber. The plugs provide surfaces that alter the plasma chemical composition locally, thus shaping the etch profile. One or more plugs of different shapes and sizes can be interchanged between plasma etch processes, to accommodate respective process requirements. The present invention provides a low cost scavenging plug that allows economical etch profile customization through easy replacement to accommodate different processes, and simple and economical etching system maintenance. With a minimal increase in overall complexity, etch profiles can be economically tailored.

Figure 2:
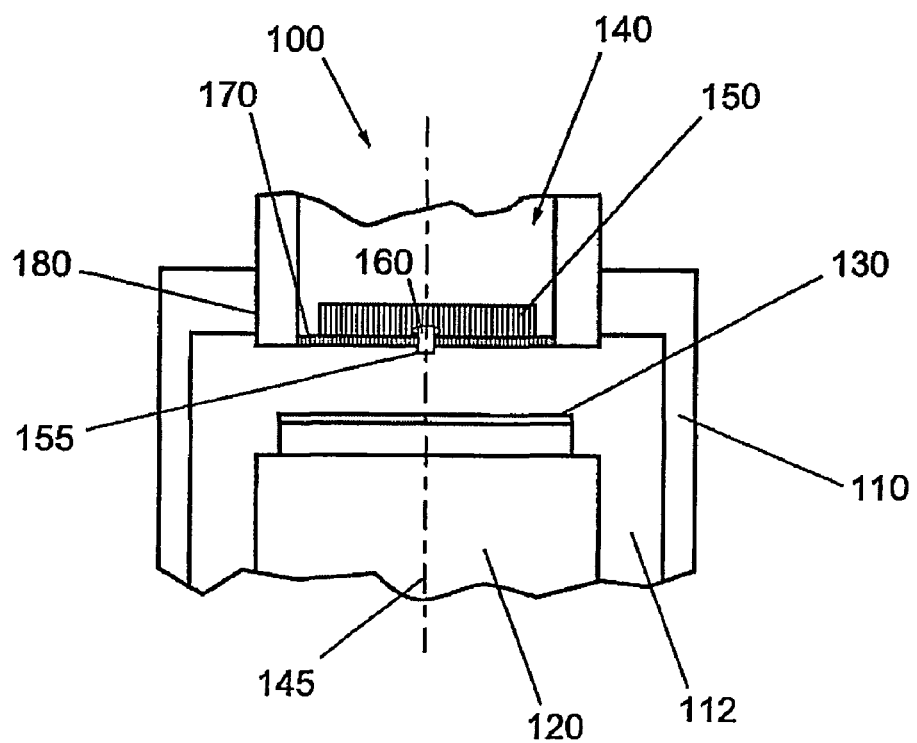
FIG. 2 illustrates a schematic etch profile tailoring system 100 according to an exemplary preferred embodiment of the present invention, including an etch profile tuning structure (plug) 160 that is removably insertable into a scavenging plate 170 so as to alter a baseline etch profile that the plate would cause if the plug were not installed.

FIG. 2 shows an exemplary consumable plug etch profile tailoring system 100 that includes a process chamber wall 110 surrounding a process chamber 112, a chuck assembly 120 on which is situated a wafer 130, and an electrode assembly 140 arranged about a center axis 145. Electrode assembly 140 includes a gas showerhead 150, a plug 160, a scavenging plate 170 and an insulator 180.

Process chamber wall 110 can be a conventional, commercially available plasma reactor chamber wall, typically fabricated from a billet of aluminum. Process chamber wall 110 can be anodized, spray-coated with a protective material (such as $Y_2O_3$), or clad with a liner to provide a protective barrier between the wall surface and the plasma.

Chuck assembly 120 is a plasma reactor wafer chuck capable of retaining a wafer 130, such as a semiconductor wafer, during processes such as plasma etch processes. Chuck assembly 120 can further include temperature control (cooling and/or heating elements and substrate back-side gas supply for improved thermal conductance between the substrate backside and the upper surface of the chuck), substrate lift pins for transfer of the substrate to and from chuck assembly 120, an RF bias electrode for substrate biasing and ion energy control, and any other elements known to those skilled in the art to be appropriate for the process involved.

Wafer 130 can be a conventional production work piece, e.g. a silicon wafer having a diameter of 200 mm on which semiconductor integrated circuits are formed. The scope of this invention is not limited by the diameter of wafer 130, nor is it limited to silicon substrates or substrates on which integrated circuits are being formed.

Electrode assembly 140 contains all the conventional electronics, heating and cooling elements, and gas injectors required to supply process gasses to process chamber 112 and to couple RF power to these gasses to form plasma.

Gas showerhead 150 can be a conventional plasma showerhead (typically fabricated from aluminum) having a plurality of orifices through which process gasses are delivered to process chamber 112.

Scavenging plate 170 can be a disk that can be made of a scavenging material such as silicon for oxide etch processes. Other materials for the scavenging plate can include carbon. Scavenging plate 170 has a plurality of through-holes substantially aligned to the orifices in gas showerhead 150. The dimensions of scavenging plate 170 and showerhead 150 can vary with the diameter of gas showerhead 150. As an example, for 200 mm wafer processing, scavenging plate 170 has a diameter 280 mm and gas showerhead 150 has a diameter of 280 mm.

Etch profile tuning structure 160 is a removable plug, preferably formed from a scavenging material such as quartz, carbon or silicon. Plug 160 can be formed into a variety compositions, shapes and sizes to conform to the process and etch conditions, and to achieve the desired effects on an etch profile, various features of plugs being described below with respect to FIGS. 3A–3C.

Plug hole 155 is a through-hole in scavenging plate 170, having a diameter slightly greater than the diameter of plug 160, allowing for dimension variations within production tolerances. The diameter of plug hole 155 is chosen to allow plug 160 to fit snugly, yet be readily removable if desired such as by complementary threading of the plug and plug hole.

Insulator 180 is a hollow cylinder, typically fabricated from alumina, and capable of electrically isolating electrode assembly 140 from process chamber wall 110. Dimensions may vary to correspond with electrode assembly 140 and process chamber wall 110. Additional insulators (not shown) may also be provided, such as a shield ring (typically fastened to the outer periphery of the insulator 180 and preferably made from quartz) such that the inner diameter of the ring resides within the diameter of the bolt pattern for fastening the scavenging plate 170 to the gas showerhead 150. As is appreciated by those skilled in the art, such shield rings provide a protective barrier between both the lower surface of insulator 180 and the fastening bolts for electrode plate 170, and the plasma.

Within process chamber 112 are chuck assembly 120 and wafer 130. Chuck assembly 120 holds wafer 130 centered on center axis 145. Electrode assembly 140 is fixedly secured within insulator 180, which is fixedly attached to process chamber wall 110. Electrode assembly 140 is functionally attached to gas showerhead 150. Gas showerhead 150 is functionally attached to scavenging plate 170 such that both are co-axial to center axis 145. In one embodiment, plug hole 155 and scavenging plate 170 are both co-axial with center axis 145. Plug 160 fits in plug hole 155, and is further detailed in FIGS. 3A–3C.

In operation, gas showerhead 150 injects gas through scavenging plate 170 and into process chamber 112 where plasma is formed in process chamber 112 between electrode assembly 140 and wafer 130. Gas showerhead 150 can also inject gases through plug 160 into process chamber 112 if the embodiment of plug 160 being used includes gas holes 167 (see FIG. 3B).

Plug 160 and scavenging plate 170 are bombarded by ion species from the plasma and introduce additional specie(s) corresponding to the composition of the scavenging plate 170 and plug 160, thus altering the chemical composition of the plasma between plug 160 and wafer 130 and modifying the etch profile. According to the invention, a plurality of plugs 160 can be employed to adjust the total surface area of electrode assembly 140 and consequently tailor the etch rate profile as the process demands.

Figure 3A:
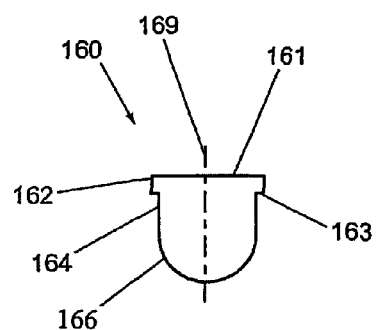
FIGS. 3A, 3B, and 3C (which may hereinafter be referred to as FIG. 3) illustrate examples of scavenging plate plugs and various features thereof, according to exemplary preferred embodiments of the present invention.
Figure 3B:
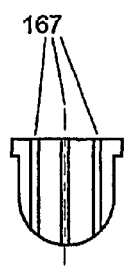
Figure 3C:
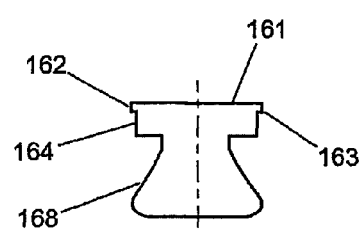

FIGS. 3A, 3B and 3C show embodiments of plug 160 having a first surface 161, a second surface 162, a third surface 163, a fourth surface 164, a center axis 169, a first exemplary profile 165 (FIG. 3A), optional gas holes 167 (FIG. 3B), and a second example of a profile 168 (FIG. 3C).

As an example, to which the scope of the invention should not be limited, for 200 mm wafer processing, first surface 161 is a planar surface having a diameter of approximately 30 to 210 mm (and preferably 60 mm) and center axis 169. Second surface 162 is cylindrically (radially) symmetrical about center axis 169, and serves as a lip to facilitate positioning plug 160 in plug hole 155. Second surface 162 is approximately 15 to 105 mm (and preferably 30 mm) from center axis 169 and has a width of approximately 5 mm. Third surface 163 is parallel to first surface 161 and is cylindrically symmetrical about center axis 169. Third surface 163 has an inside diameter of approximately 20 to 200 mm (and preferably 50 mm) and an outside diameter of approximately 30 to 210 mm (and preferably 60 mm). Fourth surface 164 is also cylindrically symmetrical about center axis 169. Fourth surface 165 is approximately 10 to 100 mm (and preferably 25 mm) from center axis 162 and has a width of approximately 5 mm.

First exemplary profile 166 and second exemplary profile 168 represent any of a variety of curves. First and second profiles 166 and 168 may have a diameter of approximately 20 to 200 mm, depending on the given etch process (and preferably about 50 mm as a general rule). More generally, the shape of profiles 166 and 168 can be varied to control the total surface area of plug 160 so as to controllably alter the etch profile and customize it to particular etching processes.

Gas holes 167 (see FIG. 3B) are through-holes of diameters ranging from 0.025 to 1 mm (preferably 0.5 mm). Gas holes 167 can be spaced radially or rectangularly every 10 mm from the plug's center axis or other distances. Gas holes 167 extend through plug 160 beginning in first surface 161 ending at the profile's surface. Gas holes 167 are arranged so that they functionally align with the orifices of gas showerhead 150.

Figure 4:
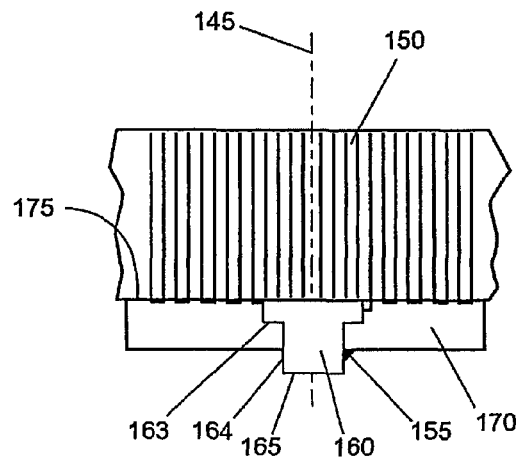
FIG. 4 is a schematic close-up of a portion of the inventive etch profile tailoring system embodiment shown in FIG. 2.

FIG. 4 illustrates in a close-up view, part of the exemplary preferred plug etch profile tailoring system 100 from FIG. 2. A simple embodiment is centered about axis 145 and includes gas showerhead 150, plug hole 155, plug 160 with third surface 163 and fourth surface 164 and profile 165, and scavenging plate 170 having a top surface 175. In the exemplary embodiment described above, gas showerhead 150, plug 160 and scavenging plate 170 are coaxial about center axis 145. Gas showerhead 150 contacts top surface 175 of scavenging plate 170. Third surface 163 of plug 160 fits into a recess in scavenging plate top surface 175, such that fourth surface 164 is disposed within plug hole 155 and profile 165 protrudes through plug hole 155.

A further embodiment includes a moveable plug that can be extended from or retracted back into the electrode assembly, effectively increasing or decreasing the surface area of scavenging material exposed to the process chamber. The plug can be made movable by making surface 164 threaded to complement threads on the interior surface of plug hole 155. In this implementation, the amount by which the threaded plug is screwed into plug hold 155 determines the extent to which profile 165 protrudes into the process chamber. In this embodiment, the shape of the etch profile can be finely tuned. Furthermore, as an etch process continues and the scavenger material constituting the plug is consumed, the plug can be screwed further into the process chamber to maintain its constant scavenging effect and extend the etch profile corrective action of a single plug.

In addition to the single-plug embodiment shown in FIGS. 2 and 4, the invention provides additional embodiments in which plural plugs are used. For example, a cluster of plugs may be arranged symmetrically in one or more rings about center axis 145 to alter the etch profile spatially across the wafer in a more customizable manner. Similarly, a single, larger, toroidal plug may be employed to achieve a similar result.

Figure 5:
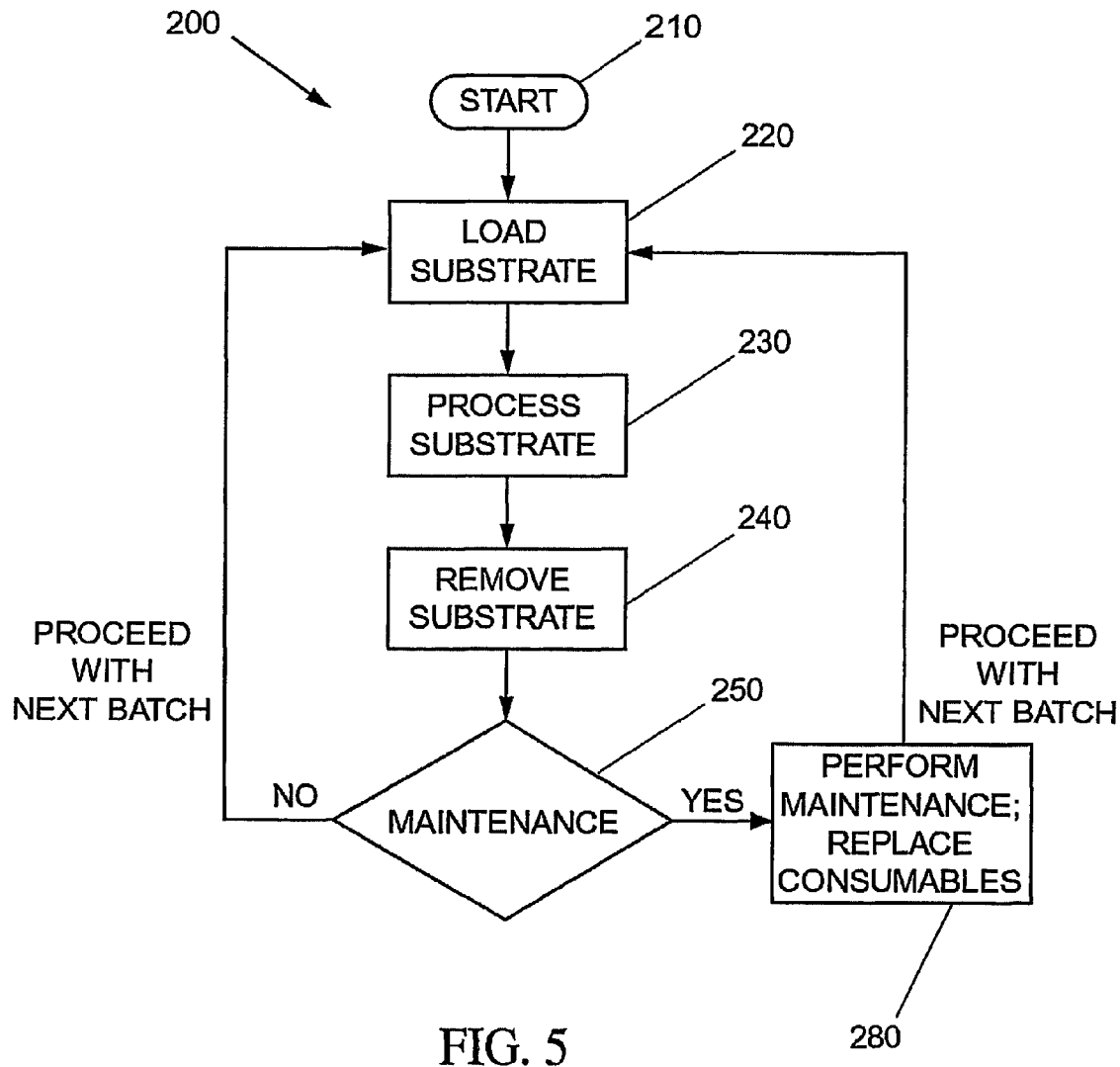
FIG. 5 is a flow chart illustrating a method of identifying maintenance cycles for replacement of items that are "consumables," such as the plugs of FIGS. 3A–3C.

FIG. 5 is a flow chart illustrating a method 200 of identifying maintenance cycles for consumable replacement, and includes the following steps.

Step 210 indicates that the method is initiated.

Step 220 indicates the step of loading the substrate (wafer). Wafer 130 can be loaded onto chuck assembly 120 by conventional means including a substrate transfer station, robotic arm and chuck assembly substrate lift pins. Once wafer 130 is set atop chuck assembly 120, an electrostatic gripping force is applied to secure the substrate to the chuck and backside gas is delivered to the substrate backside to improve thermal contact between wafer 130 and chuck assembly 120. Wafer 130 is now loaded and ready for the initiation of process.

Step 230 indicates the step of processing the substrate. Following a specific process recipe, process chamber 112 is purged and evacuated to a base pressure, and process gas is introduced to process chamber 112 via gas showerhead 150. A plasma is ignited and the process is initiated. The process proceeds until the process endpoint is detected, customarily determined by monitoring light emission from the plasma.

Step 240 indicates the step of unloading the substrate. The procedure described with reference to loading Step 220 is carried out in reverse order, to remove the substrate from the process chamber.

Step 250 is a decision block indicating the decision of whether maintenance must be performed on the consumable etch tailoring system according to the present invention. After wafer 130 is completely processed, the RF hours for the substrate processing are registered within a control processor utilized to monitor the chamber status. If the number of RF hours exceeds a pre-specified limit (typically 500 to 1000 RF hours), then consumable etch tailoring system 100 is scheduled for maintenance at the next convenient time in the IC fabrication plant, for example, following the completion of the current batch of substrates. If maintenance is required, then control passes to Step 280. If maintenance is not required, then the remaining substrates in the current batch are processed in accordance with Steps 220 through 250 as discussed above.

Step 280 indicates the step of perform maintenance and replacing consumables. In this step, process chamber 112 is purged, the chamber pressure is elevated to atmospheric pressure, and process chamber 112 is opened. The consumables, which include plug 160 (and, less often, the entire scavenging plate 170), are removed and replaced. Advantageously, a plug configured to one process can be replaced with a second plug configured for a different process, so that the same scavenging plate can be used successively but for different processes. Other maintenance functions, such as chamber cleaning, may take place at this time as well. The apparatus is returned to its functional state before the process continues with Steps 220 through 250 as discussed above.

Since the scavenging electrode plate and scavenging plug are process consumables, their erosion in time can lead to undesirable process drift. Therefore, the process kit, which contains process consumables such as the scavenging electrode plate and scavenging plug, is generally scheduled for replacement every several hundred RF hours. During process kit replacement, it is necessary for the process chamber to be released to atmosphere, opened, and partially disassembled, which often leads to significant machine downtime.

In an embodiment of the present invention, a method of replacing the inject plate and scavenging plug without disturbing the process chamber vacuum and disassembly of the process chamber is described. The substrate transfer system can be modified to further include an electrode cassette station that houses pre-assembled scavenging electrode plates with scavenging plugs inserted therein. Following procedures similar to the transfer of a substrate into and out of a process chamber by the transfer system, the pre-assembled scavenging electrode plate can be exchanged as well. Once the (vacuum) pressure between the process chamber and transfer chamber are equilibrated, a gate valve separating the two chambers can be opened allowing the passage of the robotic transfer arm housed within the transfer system. An electrode retention mechanism, utilized to couple the scavenging electrode plate to the upper electrode structure, can be lowered to permit the robotic transfer arm to engage the scavenging electrode plate and remove it from the process chamber. The removed scavenging electrode plate is stored within a slot in the electrode cassette and a new, pre-assembled scavenging electrode plate is retrieved from the electrode cassette, transferred into the process chamber, and similarly engaged with the electrode retention mechanism. The electrode retention mechanism raises the scavenging electrode plate to couple it again to the upper electrode structure. Once the robotic transfer arm is removed from the process chamber, the gate valve can be closed and substrate processing can continue. For further details, a method and apparatus for electrode transfer into and out of a process chamber is described in pending U.S. Pat. No. U.S. 01/22508 filed on Jul. 19, 2001 (claiming priority to U.S. Provisional Ser. No. 60/219,737, filed on Jul. 20, 2000), and it is incorporated herein by reference in its entirety.

It may also be possible to embed a magnet or a magnetizable material (e.g., an iron core) within the scavenging plug as well as embedding a magnet in the upper electrode, the combination of which could serve to provide sufficient magnetic coupling to couple the scavenging plug to the upper electrode. A robotic transfer arm may then permit engaging the scavenging plug and transferring the scavenging plug. Furthermore, additional cooling of the upper electrode is required to preserve the magnetic properties of the embedded magnets.

Modifications and variations of the above-described embodiments of the present invention are possible, as appreciated by those skilled in the art in light of the above teachings. For example, various sizes and shapes and quantities and arrangements of etch profile tuning structures such as scavenging plate plugs can be employed while remaining within the scope of the present invention. It is therefore to be understood that, within the scope of the appended claims and their equivalents, the invention may be practiced otherwise than as specifically described.

What is claimed is:

1. An etch profile tailoring system for use with an etching process carried out on a wafer, the etch profile tailoring system comprising:
    a scavenging plate configured to function in accordance with a baseline etch profile during the etching process; and
    at least one etch profile tuning structure, replaceably disposed with respect to the scavenging plate, and made of a scavenging material configured to alter the baseline etch profile during the etching process so as to arrive at a desired etch profile for the process.

2. The system of claim 1, wherein the etch profile tuning structure includes:
    a plug that is removably insertable into a plug hole formed in the scavenging plate.

3. The system of claim 2, wherein the plug is radially symmetrical about a center line that passes through a center of the plug hole centrally located in the scavenging plate.

4. The system of claim 2, further comprising:
    additional plugs, arranged about the scavenging plate so as to form a pattern of plugs that affects the etch profile.

5. The system of claim 2, wherein:
    the plug hole in the scavenging plate and the plug are complementarily threaded; and
    the threaded plug is configured to be screwed in the threaded plug hole to adjust an amount by which the threaded plug protrudes into a process chamber in which the etching process is performed.

6. The system of claim 1, wherein the at least one etch profile tuning structure comprises quartz, carbon or silicon, or any combination thereof.

7. The system of claim 1, wherein composition, shape or size, or any combination thereof, of the etch tuning profile structure is predetermined to achieve desired effects on the etch profile.

8. An etch profile tailoring method for use with an etching process, the method comprising:
    providing a scavenging plate that functions in the etching process in accordance with a baseline etch profile; and
    altering the baseline etch profile to arrive at a desired etch profile by inserting at least one replaceable etch profile tuning structure made of a scavenging material for the etching process.

9. The method of claim 8, wherein the baseline etch profile altering step includes:
    inserting a removable plug into a plug hole formed in the scavenging plate.

10. The method of claim 9, wherein the plug is radially symmetrical about a center line that passes through a center of the plug hole centrally located in the scavenging plate.

11. The method of claim 9, further comprising:
    arranging additional plugs about the scavenging plate so as to form a pattern of plugs that affects the etch profile.

12. The method of claim 9, wherein:
    the plug hole in the scavenging plate and the plug are complementarily threaded; and
    the method further comprises screwing the threaded plug in the threaded plug hole to adjust an amount by which the threaded plug protrudes into a process chamber in which the process is performed.

13. The system of claim 8, wherein the at least one etch profile tuning structure comprises quartz, carbon or silicon, or any combination thereof.

14. A method of performing maintenance on an etch profile tailoring system used in etching processes carried out on wafers, the etch profile tailoring system including etch profile tuning structures configured to alter a baseline etch profile to arrive at respective desired etch profiles, the method comprising:
    performing an etching process on a wafer in accordance with the desired etch profile;
    determining whether or not maintenance should be performed on the etch profile tailoring system, to arrive at a maintenance decision; and
    if the maintenance decision indicates that maintenance should be performed, replacing a first etch profile tuning structure with a second etch profile tuning structure before conducting an etching process on additional wafers, wherein the first and second etch profile tuning structures are made of a material that is a scavenging material for the etching process.

15. The method of claim 14, wherein the replacing step includes:
    removing a first removable plug from a plug hole formed in the scavenging plate; and inserting a second removable plug into the plug hole.

16. The method of claim 15, wherein the plug is radially symmetrical about a center line that passes through a center of the plug hole centrally located in the scavenging plate.

17. The method of claim 15, further comprising:
    arranging additional plugs about the scavenging plate so as to form a pattern of plugs that affects the etch profile.

18. The method of claim 15, wherein:
    the plug hole in the scavenging plate and the plug are complementarily threaded; and
    the method further comprises screwing the threaded plug in the threaded plug hole to adjust an amount by which the threaded plug protrudes into a process chamber in which the etching process is performed.

19. The method of claim 14, wherein the second etch tuning profile structure has a composition, shape or size, or a combination thereof, which is different from said first etch tuning profile structure.

20. A method of tailoring etch profiles to first and second etching processes that have a baseline etch profile in common, the method comprising:
    altering the baseline etch profile using a first etch profile tuning structure so as to define a first desired etch profile, and performing the first etching process in accordance with the first desired etch profile;
    replacing the first etch profile tuning structure with a second etch profile tuning structure to thus alter the baseline etch profile using the second etch profile tuning structure, so as to define a second desired etch profile; and
    performing the second etching process in accordance with the second desired etch profile, wherein the first and second etch profile tuning structures are made of a material that is a scavenging material for the etching process.

21. The method of claim 20, wherein:

the baseline etch profile is substantially defined by a scavenging plate having at least one plug hole;

the first etch profile tuning structure is a first plug configured to be removably insertable into the at least one plug hole;

the second etch profile tuning structure is a second plug configured to be removably insertable into the at least one plug hole; and the replacing step includes removing the first plug from the at least one plug hole and inserting the second plug into the at least one plug hole.

22. The method of claim 21, wherein the first and second plugs are radially symmetrical about a center line that passes through a center of the plug hole centrally located in the scavenging plate.

23. The method of claim 21, further comprising:

arranging additional plugs about the scavenging plate so as to form a pattern of plugs that affects the etch profile.

24. The method of claim 21, wherein:

the plug hole in the scavenging plate and the first and second plugs are complementarily threaded; and the method further comprises screwing either of the first or second threaded plugs in the threaded plug hole to adjust an amount by which the first or second threaded plug protrudes into a process chamber in which the first and second etching processes are performed.

25. The method of claim 20, wherein the second etch tuning profile structure has a composition, shape or size, or a combination thereof, which is different from said first etch tuning profile structure.

* * * * *